United States Patent
Lee (10) Patent No.: US 8,848,427 B1
(45) Date of Patent: Sep. 30, 2014

(54) SEMICONDUCTOR INTERGRATED CIRCUIT AND OPERATING METHOD THEREOF

(71) Applicant: SK hynix Inc., Icheon-si (KR)

(72) Inventor: Sung Yeon Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/301,510

(22) Filed: Jun. 11, 2014

Related U.S. Application Data (62) Division of application No. 13/219,643, filed on Aug. 27, 2011.

(30) Foreign Application Priority Data

Apr. 11, 2011 (KR) .................. 10-2011-0033320

(51) Int. Cl.
*G11C 11/00* (2006.01)
*G11C 11/16* (2006.01)

(52) U.S. Cl.
CPC ............ *G11C 11/165* (2013.01); *G11C 11/161* (2013.01)

USPC .................. 365/148; 365/158; 365/173

(58) Field of Classification Search
CPC .... G11C 11/16; G11C 11/15; G11C 11/5607; G11C 13/0004; G11C 13/0069; G11C 13/0038; G11C 13/004; G11C 11/1673; G11C 2013/0071; G11C 2211/5615
USPC .................. 365/148, 158, 163, 171, 173
See application file for complete search history.

(56) References Cited

U.S. PATENT DOCUMENTS 8,553,444 B2 * 10/2013 Muraoka et al. ............ 365/148
2013/0044534 A1 * 2/2013 Kawai et al. ................. 365/148

* cited by examiner

*Primary Examiner* — Hien Nguyen
(74) *Attorney, Agent, or Firm* — William Park & Associates Patent Ltd.

(57) ABSTRACT

A semiconductor integrated circuit includes a variable resistive element, a current supply unit and a control signal generating unit. The resistance of the variable resistive element is changed depending on current flowing therethrough. The current supply unit controls the current in response to a control signal. The control signal generating unit generates the control signal by sensing the change in the resistance of the variable resistive element.

20 Claims, 6 Drawing Sheets

SEMICONDUCTOR INTERGRATED CIRCUIT AND OPERATING METHOD THEREOF

CROSS-REFERENCES TO RELATED APPLICATION

The present application claims priority under 35 U.S.C. §119(a) to Korean Patent Application No. 10-2011-0033320, filed on Apr. 11, 2011, in the Korean Intellectual Property Office, which is incorporated herein by reference in its entirety as set forth in full.

BACKGROUND

1. Technical Field

The present invention relates to a semiconductor integrated circuit, and more particularly, to a semiconductor integrated circuit having a variable resistive element.

2. Related Art

Magnetic random access memory (MRAM) is a memory device configured using a magnetic tunnel junction (MTJ) memory element. MTJ is a structure in which two ferromagnetic layers formed at both sides of a middle insulating layer. In the MTJ, the ferromagnetic layer formed at one side of the insulating layer is referred to as a pinned layer or fixed layer of which spin direction is not changed by an external stimulus, and the ferromagnetic layer formed at the other side of the insulating layer is referred to a free layer of which spin direction is relatively easily changed by an external stimulus such as an external magnetic field or spin transition of through current. A thin insulating layer for electrical/magnetic insulation such as MgO layer, according to an example, having a thickness of 1 nm or less, is formed between the two ferromagnetic layers.

The resistance of the MTJ is changed depending on a magnetic orientation state of the two ferromagnetic layers that constitute the MTJ, which is referred to as a tunneling magneto resistance (TMR) phenomenon. The ratio between two resistances depending on the magnetic orientation state of the two ferromagnetic layers is referred to as a TMR ratio. In the MRAM, data is recorded or read using a resistance change of the MTJ, i.e., a variable resistance.

A field induced magnetic switching (FIMS) method and a spin transfer torque (STT) method are used as the recording method of the MRAM. The FIMS method is a method of changing the spin direction of the free layer using a strong external magnetic field. However, since the FIMS method requires a separate component for generating an external electric field, it is not easy to perform the integration of the MRAM.

On the other hand, the STT method is a method of changing the spin direction of the free layer through spin transition of electrons by orienting the spin direction of the electrons that pass through the MTJ using the influence of interaction/reaction generated between the spin characteristic of the electrons and the spin direction of the ferromagnetic layer when the electrons pass through the ferromagnetic layer and then passing the electrons through the free layer. That is, the STT method adjusts the variable resistance of the MTJ by controlling the spin direction of the MTJ according to the direction of current passing through the MTJ.

As described above, the variable resistance of the MTJ using the STT method is adjusted by the current passing through the MTJ.

In the adjustment of the variable resistance of the MTJ, an amplitude of a current pulse increases as the width of the current pulse flowing through the MTJ decreases. Here, the width of the current pulse may be a duration of the current applied to the MTJ. However, if the amplitude of the current pulse increases, the voltage applied to both ends of the MgO that is an insulating layer of the MTJ increases to increase the amplitude of the current pulse, and thus the element characteristic of the MgO may be degraded. The degradation of the insulating layer may result in the resistance drift phenomenon of the MTJ and reduce the reliability of the element.

On the contrary, if the width of the current pulse flowing through the MTJ increases to decrease the voltage applied to both the ends of the MgO, the degradation of the insulating layer may also be caused. If the duration of the current flows in the MgO increases, the MgO may be degraded, and therefore, the TMR ratio that is a main index of variable resistance characteristics of the MTJ may deteriorate. Accordingly, the lifespan of the MTJ may decrease.

The characteristics of the MTJ have influence on the timing of a recording operation of an STTMRAM. In order to perform a stable recording operation of the STTMRAM, a width of a writing current pulse, i.e., current flowing through the MTJ is necessarily set to have a sufficient margin. However, an operation speed of a semiconductor memory device may deteriorate due to the setting of the sufficient margin to the width of the current pulse flowing through MTJ.

SUMMARY

In an embodiment of the present invention, a semiconductor integrated circuit includes a variable resistive element of which resistance is changed depending on current flowing therethrough; a current supply unit configured to control the current in response to a control signal; and a control signal generating unit configured to generate the control signal by sensing the change in the resistance of the variable resistive element.

In an embodiment of the present invention, a semiconductor integrated circuit includes a variable resistive element connected between a first node and a second node, the variable resistive element of which resistance is changed depending on the direction of current between the first and second nodes; a first supply current control unit connected between an external voltage and the first node so as to control the supply of current from the external voltage to the first node in response to an input signal; a first sink current control unit connected between the second node and a ground voltage so as to control a current sink from the second node to the ground voltage in response to the input signal; a second supply current control unit connected between the external voltage and the second node so as to control the supply of current from the external voltage to the second node in response to the input signal; and a second sink current control unit connected between the first node and the ground voltage so as to control a current sink from the first node to the ground voltage in response to the input signal, wherein one or more of the first supply current control unit, the first sink current control unit, the second supply current control unit and the second sink current control unit control the current according to not only the input signal but also the resistance of the variable resistive element.

In an embodiment of the present invention, a semiconductor integrated circuit includes a memory element for transforming a variable resistive state, connected between a first node and a second node, the memory element of which resistance is changed depending on a direction of current between the first and second nodes; a first supply current control unit connected between an external voltage and the first node so as to control the supply of current from the external voltage to the first node in response to an input signal received as new data for recording; a first sink current control unit connected between the second node and a ground voltage so as to control a current sink from the second node to the ground voltage in response to the input signal; a second supply current control unit connected between the external voltage and the second node so as to control the supply of current from the external voltage to the second node in response to the input signal; and a second sink current control unit connected between the first node and the ground voltage so as to control a current sink from the first node to the ground voltage in response to the input signal, wherein one or more of the first supply current control unit, the first sink current control unit, the second supply current control unit and the second sink current control unit supply or interrupt the current flowing through the memory element depending on the presence of identity between data previously recorded in the memory element and new data for recording.

In an embodiment of the present invention, a semiconductor integrated circuit includes a variable resistive element configured to include a first ferromagnetic layer, a second ferromagnetic layer and an insulating layer formed between the first and second ferromagnetic layers, the variable resistive element of which resistance is changed depending on current flowing through the first ferromagnetic layer, the insulating layer and the second ferromagnetic layer; and a current control unit configured to control the current flowing through the variable resistive element according to the resistance of the variable resistive element.

BRIEF DESCRIPTION OF THE DRAWINGS

Features, aspects, and embodiments are described in conjunction with the attached drawings, in which.

DETAILED DESCRIPTION

Hereinafter, a semiconductor integrated circuit and an operating method thereof according to the present invention will be described below with reference to the accompanying drawings through exemplary embodiments.

A semiconductor integrated circuit according to the present invention controls current flowing through a variable resistive element such as an MTJ according to the resistance of the variable resistive element, thereby reducing current unnecessarily flowing through the variable resistive element.

If the current unnecessarily flowing through the variable resistive element is reduced, a probability of degradation of the variable resistive element may decrease, so that the lifespan of the semiconductor integrated circuit can increase.

Further, in a semiconductor memory device of the present invention, it is possible to prevent a duplicate record of data by comparing existing and new data of a data cell using the variable resistive element such as the MTJ.

Furthermore, the semiconductor integrated circuit of the present invention reduces current unnecessarily flowing through the variable resistive element, thereby reducing power consumption.

Figure 1:
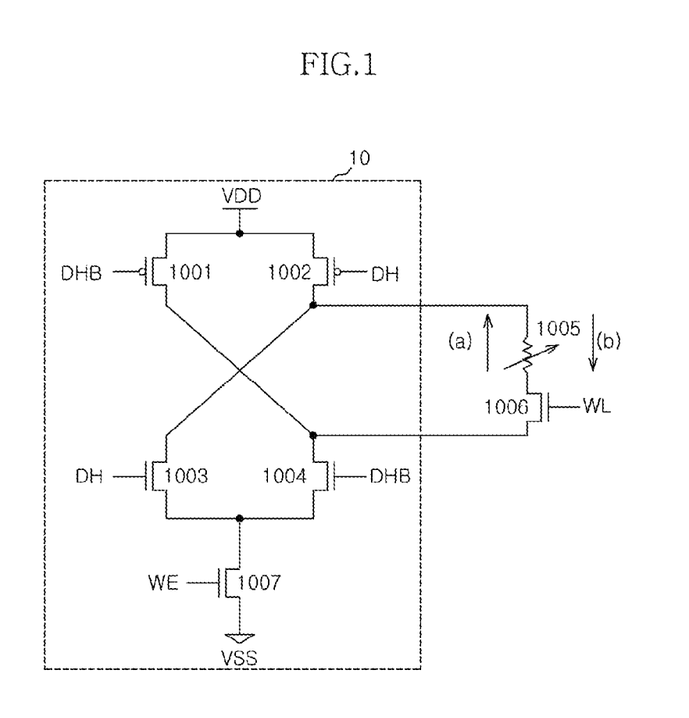
FIG. 1 is an exemplary circuit diagram illustrating a recording method of a STTRAM.

FIG. 1 is an exemplary circuit diagram illustrating a recording method of a STTMRAM.

In FIG. 1, there are shown an MTJ 1005, a bidirectional driver 10 for writing the MTJ and a word line transistor 1006.

The STTMRAM includes a plurality of MTJs 1005 as memory elements, and a specific MTJ 1005 may be selected by the word line transistor 1006 that receives a word line select signal WL.

In the semiconductor memory device, the word line select signal WL is a signal for selecting one from word lines formed, for example, in rows so as to access a desired memory device.

For example, when data to be recorded in the MTJ 1005 is '1', an input signal DH becomes a high-level signal, and an input signal DHB becomes a low-level signal that is signal with an inverted level of the input signal DH. On the contrary, when the data to be recorded in the MTJ 1005 is '0', the input signal DH becomes a low-level signal, and the input signal DHB becomes a high-level signal. The input signal DHB is a signal obtained by inverting the input signal DH.

If the input signal DH is a high level during a time when a write enable signal WE is activated, transistors 1001 and 1003 are turned on and transistors 1002 and 1004 are turned off, so that current flows in direction (a). On the contrary, if the input signal DHB is a high-level signal, the transistors 1002 and 1004 are turned on and the transistors 1001 and 1003 are turned off, so that current flows in direction (b).

The write enable signal WE is a signal that controls the semiconductor memory device to record data in the memory element.

The bidirectional write drivers 1001, 1002, 1003 and 1004 shown in FIG. 1 allow desired data to be recorded in the MTJ 1005 by controlling current flowing through the MTJ 1005 to flow in the directions (a) and (b).

Here, the time when the bidirectional write drivers 1001 to 1004 shown in FIG. 1 supply current to the MTJ 1005 is determined depending on the write enable signal WE. Accordingly, the bidirectional write drivers 1001, 1002, 1003 and 1004 shown in FIG. 1 provide a constant width of write current (pulse width of the write enable signal) to the MTJ 1005, regardless of which value data previously recorded in the MTJ 1005 and new data for recording have.

Figure 2A:
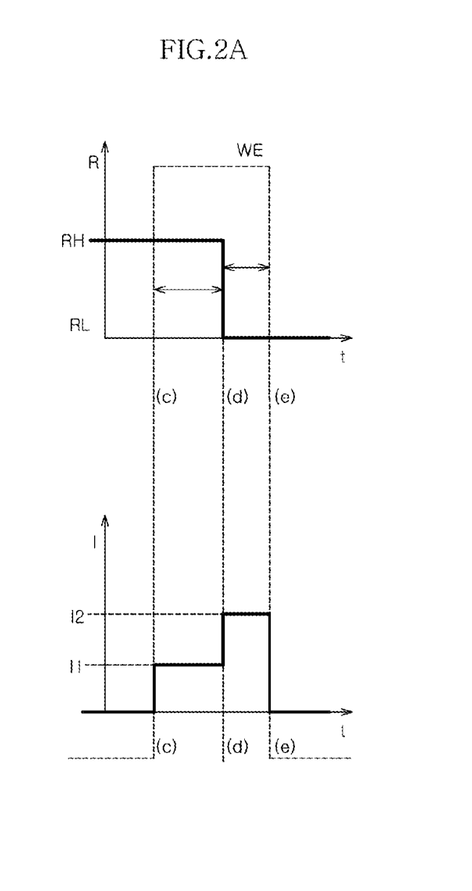
FIGS. 2A and 2B are waveform diagrams illustrating the resistance and current of an MTJ, changed depending on current flowing through the MTJ during a period in which a write enable signal is activated.
Figure 2B:
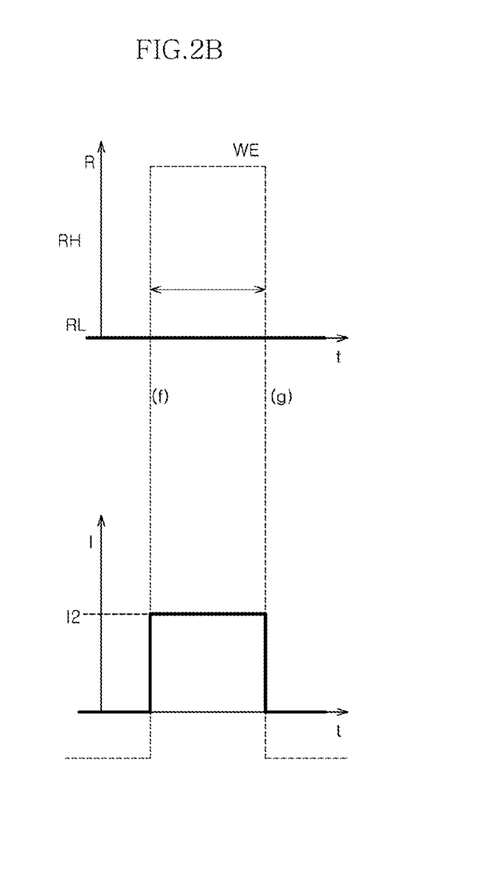

FIGS. 2A and 2B are waveform diagrams illustrating the resistance and current of the MTJ 1005, changed depending on current flowing through the MTJ 1005 during a time when the write enable signal WE is activated.

FIG. 2A is a waveform diagram illustrating that the resistance previously set in the MTJ 1005 is a high resistance, and the resistance of the MTJ 1005 is changed into a low resistance as current flows through the MTJ 1005.

Further, FIG. 2A is a waveform diagram illustrating a change in resistance R of the MTJ 1005 according to time t and a waveform diagram illustrating a change in current I flowing through the MTJ 1005 according to the time t.

FIG. 2A illustrates a waveform diagram when the data previously recorded in the MTJ 1005 is '0' and new data is recorded as '1' or when the data previously recorded in the MTJ 1005 is '1' and new data is recorded as '0'.

Current having a direction according to the input signal DH or DHB passes through the MTJ 1005 during time (c) to (e) when the write enable signal WE is activated as a high-level signal.

If the current flows through the MTJ 1005 during time (c) to (d) or more, the resistance of the MTJ 1005 is changed from a high resistance RH to a low resistance RL depending on a change in spin direction of a free layer in the MTJ 1005 (d).

The current flowing through the MTJ 1005 from time (c) when the write enable signal WE is activated as a high-level signal to time (d) when the resistance of the MTJ 1005 maintains a high resistance RH is I1. The current I1 has an amplitude smaller than that of I2 that is a current flowing through the MTJ 1005 from the time (d) when the resistance of the MTJ 1005 is changed into a low resistance RL to time (e) when the write enable signal WE is deactivated as a low-level signal.

Then, as the write enable signal WE is deactivated as a low-level signal, the current flowing through the MTJ 1005 is interrupted (e). Although the current flowing through the MTJ 1005 is interrupted, the spin direction of the MTJ 1005 maintains the changed state, and accordingly, the resistance of the MTJ 1005 is also maintained as a low resistance RL.

In order to perform stable data recording, the write enable signal WE maintains an activation time while having margin (d) and (e), in addition to time (c) and (d) taken in that the resistance of the MTJ 1005 is changed.

In the waveform diagram of FIG. 2A, the time when current flows through the MTJ 1005 is the time (c) to (e) that is a time when the write enable signal WE is activated. Here, the margin (d) and (e), except the time (c) and (d) taken in that the resistance of the MTJ 1005 is changed, is a time when the current passes through the MTJ 1005 regardless of data recording.

FIG. 2B is a waveform diagram when, although current flows through the MTJ 1005, the resistance of the MTJ 1005 maintains a low resistance RL because the previously set resistance of the MTJ 1005 is the low resistance RL.

FIG. 2B illustrates a waveform diagram when the data previously recorded in the MTJ 1005 is '0' and new data is recorded as '0' or when the data previously recorded in the MTJ 1005 is '1' and new data is recorded as '1'.

Current having a direction according to the input signal DH or DHB passes through the MTJ 1005 during time (f) and (g) when the write enable signal WE is activated as a high-level signal.

Since the resistance of the MTJ 1005 is previously in the state of a low resistance RL, the resistance of the MTJ 1005 maintains the state of the low resistance RL regardless of the time when the current flows through the MTJ 1005.

The current flowing through the MTJ 1005 during the time (f) and (g) has I2 corresponding to the low resistance RL of the MTJ 1005.

Then, If the write enable signal WE is activated as a low-level signal (g), the current flowing through the MTJ 1005 is interrupted (g).

Accordingly, the time when the current flows through the MTJ 1005 in the waveform diagram of FIG. 2B is the time (f) and (g) that is identical to the time (c) to (e) described above.

Since the resistance of the MTJ 1005 is not changed in the waveform diagram of FIG. 2B, the time (f) and (g) is a time when the current flows through the MTJ 1005 regardless of data recording.

That is, the width of the current during the time (d) to (e) in the waveform diagram of FIG. 2A or the width of the current during the time (f) and (g) in the waveform diagram of FIG. 2B corresponds to the time when the current passes through the MTJ 1005 without having influence on the data recording.

Although the data recording is not influenced, an operation speed of a semiconductor memory device may deteriorate due to the current flowing through the MTJ 1005. In addition, the current flowing through the MTJ 1005 may degrade an insulating layer (e.g., MgO, but not limited thereto) provided to the MTJ 1005, and therefore, the lifespan of the STTRAM may be reduced.

Figure 3:
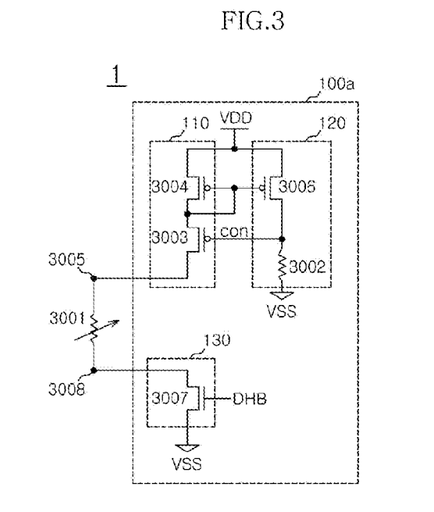
FIG. 3 is a schematic circuit diagram of a semiconductor integrated circuit according to an embodiment of the present invention.

FIG. 3 is a schematic circuit diagram of a semiconductor integrated circuit 1 according to an embodiment of the present invention.

The semiconductor integrated circuit 1 includes a variable resistive element 3001 and a current control unit 100a.

The resistance of the variable resistive element 3001 is changed depending on current flowing through the variable resistive element 3001.

The variable resistive element 3001 may include an MTJ recorded using an STT method.

The current control unit 100a controls the current flowing through the variable resistive element 3001 according to the resistance of the variable resistive element 3001.

The current control unit 100a includes a current supply unit 110, a control signal generating unit 120 and a current sink unit 130.

The current supply unit 110 controls the current flowing through the variable resistive element 3001 in response to a control signal con.

The control signal generating unit 120 senses a resistance of the variable resistive element 3001 and generates the control signal con in response to the sensed result and an input signal DHB.

The current sink unit 130 sinks the current flowing through the variable resistive element 3001 in response to the input signal DHB.

The control signal generating unit 120 generates a duplicate current having an amount in proportion to that of the current flowing through the variable resistive element 3001 and applies the generated current to a reference resistor 3002. The control signal generating unit 120 uses the amplitude of a voltage applied to the reference resistor 3002 as the sensed result.

The current supply unit 110 and the current signal generating unit 120 can be configured in the form of a current-mirror type amplifier as shown in FIG. 3.

The current supply unit 110 may include PMOS transistors 3003 and 3004.

The PMOS transistors 3003 and 3004 are connected in series between an external voltage VDD and a node 3005 at which the variable resistive element 3001 is connected thereto. The PMOS transistor 3003 receives the control signal con through a gate terminal. The PMOS transistor 3004 is configured so that drain and gate terminals are connected to each other.

If the control signal con is activated as a low-level signal, the current supply unit 110 configured as described above supplies current to the node 3005 from the external voltage VDD.

If the control signal con is deactivated as a high-level signal, the current supply unit 110 interrupts the supply of current to the node 3005 from the external voltage VDD.

The control signal generating unit 120 may include a PMOS transistor 3006 and the reference resistor 3002.

The PMOS transistor 3006 is connected between the external voltage VDD and the gate terminal of the PMOS transistor 3003, and a gate terminal of the PMOS transistor 3006 is connected to the gate terminal of the PMOS transistor 3004.

The reference resistor 3002 is connected between the gate terminal of the PMOS transistor 3003 and a ground voltage VSS.

The control signal generating unit 120 configured as described above operates as follows.

Since the current supply unit 110 and the control signal generating unit 120 are configured in the form of a current-mirror type amplifier, current flowing along the current path from the external voltage VDD to the ground voltage VSS via the PMOS transistor 3006 and the reference resistor 3002 is the duplicate current having the amount in proportion to that of the current flowing through the variable resistive element 3001.

Accordingly, the voltage determined according to the amount of the duplicate current and the resistance of the reference resistor 3002 is applied to the gate terminal of the PMOS transistor 3003 as the control signal con. Thus, if the amount of the current flowing through the variable resistive element 3001 increases, the amount of the duplicate current also increases, and the voltage of the control signal con applied to the gate terminal of the PMOS transistor 3003 is boosted.

If the voltage of the control signal con is boosted to a predetermined level or higher, the PMOS transistor 3003 is turned off to interrupt the supply of current to the node 3005 from the external voltage VDD.

The current sink unit 130 may include an NMOS transistor 3007. The NMOS transistor 3007 is connected between the ground voltage VSS and a node 3008 at which the variable resistive element 3001 is connected thereto. The NMOS transistor 3007 receives the input signal DHB through a gate terminal thereof.

The semiconductor integrated circuit 1 configured as shown in FIG. 3 operates as follows.

For example, in the state that the resistance of the variable resistive element is a high resistance and the input signal DHB is deactivated as a low-level signal, the NMOS transistor 3007 is turned off to interrupt the current path from the variable resistive element 3001 to the ground voltage VSS.

Here, the current is sunk from the gate terminal of the PMOS transistor 3003 to the ground voltage VSS through the reference resistor 3002, so that the control signal con is activated as a low-level signal.

If the input signal DHB is activated as a high-level signal, the NMOS transistor 3007 is turned on to form a current path from the external voltage VDD to the ground voltage VSS via the current supply unit 110, the variable resistive element 3001 and the current sink unit 130.

Accordingly, the current starts to flow through the variable resistive element 3001.

If the current flows through the variable resistive element 3001 for a predetermined time or more, the resistance of the variable resistive element 3001 decreases from a high resistance to a low resistance.

Accordingly, the amount of the current flowing from the external voltage VDD to the ground voltage VSS via the current supply unit 110, the variable resistive element 3001 and the current sink unit 130 increases.

As the amount of the current increases, the amount of the duplicate current generated by the control signal generating unit 120 also increases. Thus, the amplitude of the voltage applied to the reference resistor 3002, i.e., the voltage of the control signal con is also boosted.

If the voltage of the control signal con is boosted to a high-level voltage, the PMOS transistor 3003 is turned off to interrupt a current path from the external voltage VDD to the node 3005.

That is, the semiconductor integrated circuit 1 shown in FIG. 3 can control the current flowing through the variable resistive element 3001 according to the resistance of the variable resistive element 3001.

Then, if the input signal DHB is deactivated as a low-level signal, the NMOS transistor 3007 is turned off to interrupt a current path from the node 3008 to the ground voltage VSS.

Figure 4:
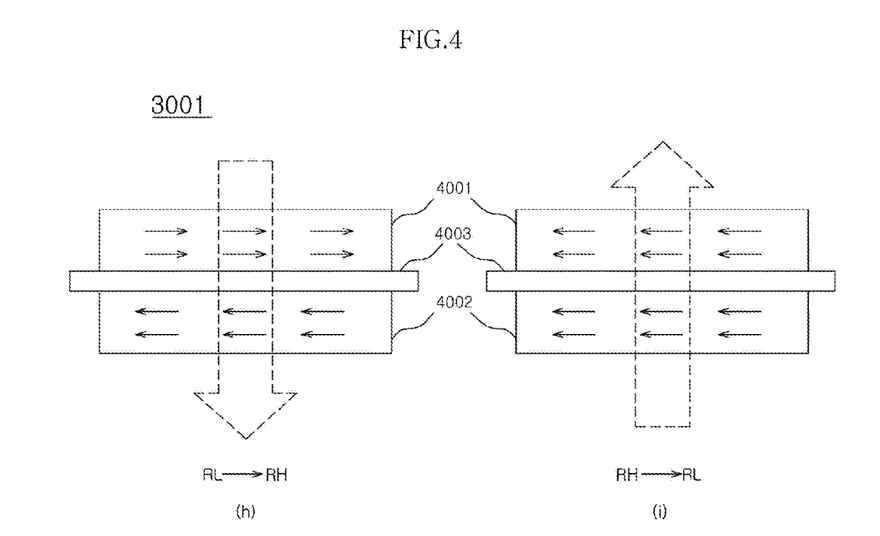
FIG. 4 is a diagram illustrating a resistance transforming method of an STT-type MTJ used as an embodiment of a variable resistive element shown in FIG. 3.

FIG. 4 is a diagram illustrating a resistance transforming method of an STT-type MTJ used as an embodiment of the variable resistive element 3001 shown in FIG. 3.

Like the general MTJ, the variable resistive element 3001 may include a first ferromagnetic layer 4001, a second ferromagnetic layer 4002 and an insulating layer 4003 formed between the first and second ferromagnetic layers 4001 and 4002.

The resistance of the variable resistive element 3001 may vary depending on current flowing through the first ferromagnetic layer 4001, the insulating layer 4003 and the second ferromagnetic layer 4002.

For example, in a case where the current sequentially flows through the first ferromagnetic layer 4001, the insulating layer 4003 and the second ferromagnetic layer 4002 as shown in (h) of FIG. 4, the resistance of the variable resistive element 3001, i.e., the resistance of the first ferromagnetic layer 4001, the insulating layer 4003 and the second ferromagnetic layer 4002 is changed from a low resistance RL to a high resistance RH.

On the contrary, in a case where the current flows through the second ferromagnetic layer 4002, the insulating layer 4003 and the first ferromagnetic layer 4001 as shown in (i) of FIG. 4, the resistance of the variable resistive element 3001, i.e., the resistance of the second ferromagnetic layer 4002, the insulating layer 4003 and the first ferromagnetic layer 4001 is changed from a high resistance RH to a low resistance RL.

One of the first and second ferromagnetic layers 4001 and 4002, e.g., the second ferromagnetic layer 4002 can be configured as a fixed layer of which spin direction is not changed by the current.

The other of the first and second ferromagnetic layers 4001 and 4002, e.g., the first ferromagnetic layer 4001 can be configured as a free layer of which spin direction is changed by the current.

The resistance of the variable resistive element 3001 may vary depending on the spin direction of the first and second ferromagnetic layers 4001 and 4002.

In the variable resistive element 3001 shown in FIG. 4, the change between the high resistance RH and the low resistance RL may occur according to the spin direction of the second ferromagnetic layer 4002 configured as the fixed layer.

For example, if the spin direction of the second ferromagnetic layer 4002 configured as the fixed layer is set in the opposite direction to the direction shown in FIG. 4, the resistance of the variable resistive element 3001 according to the flow of the current is changed from the high resistance RH to the low resistance RL in (h) of FIG. 4.

In (i) of FIG. 4, the resistance of the variable resistive element 3001 is changed from the low resistance RL to the high resistance RH.

The insulating layer 4003 is formed thin (e.g., 1 nm or less) between the two ferromagnetic layers 4001 and 4002 using a component such as MgO for the purpose of electrical/magnetic insulation.

As current flowing through the insulating layer 4003 flows for a long period of time, the insulating layer 4003 may deteriorate, and therefore, the TMR ratio that is a main index of the MTJ may deteriorate.

Figure 5:
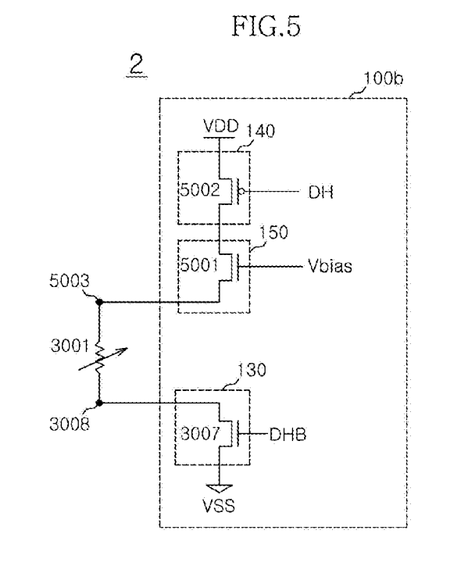
FIG. 5 is a schematic circuit diagram of a semiconductor integrated circuit according to an embodiment of the present invention.

FIG. 5 is a schematic circuit diagram of a semiconductor integrated circuit 2 according to an embodiment of the present invention.

The semiconductor integrated circuit 2 includes a variable resistive element 3001 and a current control unit 100b.

The resistance of the variable resistive element 3001 is changed depending on current flowing therethrough.

The variable resistive element 3001 can be configured identically to the variable resistive element 3001 shown in FIG. 3.

The current control unit 100b controls the current flowing through the variable resistive element 3001 according to the resistance of the variable resistive element 3001.

The current control unit 100b may include a current supply unit 140, a current interrupting unit 150 and a current sink unit 130.

The current supply unit 140 supplies the current in response to an input signal DH.

The current interrupting unit 150 provides or interrupts a path along which the current flows according to a predetermined voltage of a node 5003, changed depending on the resistance of the variable resistive element 3001.

The current supply unit 140 and the current interrupting unit 150 may include a PMOS transistor 5002 and an NMOS transistor 5001, connected in series between an external voltage VDD and the node 5003 connected to the variable resistive element 3001.

The PMOS transistor 5002 receives the input signal DH through a gate terminal thereof.

The NMOS transistor 5001 receives a bias voltage Vbias through a gate terminal thereof.

The bias voltage Vbias may be configured as a voltage having a predetermined amplitude. The operating method of the current interrupting unit 150 according to the amplitude of the bias voltage Vbias will be described below.

The current sink unit 130 can be configured identically to the current sink unit 130 shown in FIG. 3. Therefore, its detailed description will be omitted.

The semiconductor integrated circuit 2 configured as shown in FIG. 5 operates as follows.

For example, in the state that the resistance of the variable resistive element 3001 is a low resistance, an input signal DHB is activated as a high-level signal. If the input signal DH is activated as a low-level signal, the NMOS transistor 3007 and the PMOS transistor 5002 are turned on.

The NMOS transistor 5001 is turned on by the voltage difference between the bias voltage Vbias and the voltage at the node 5003.

Accordingly, there is formed a current path from the external voltage VDD to a ground voltage VSS via the current supply unit 140, the current interrupting unit 150, the variable resistive element 3001 and the current sink unit 130.

Thus, the current starts to flow through the variable resistive element 3001.

If the current flows through the variable resistive element 3001 for a predetermined time or more, the resistance of the variable resistive element 3001 increases from a low resistance to a high resistance.

Accordingly, the voltage applied to the node 5003 is boosted.

As the voltage at the node 5003 is boosted, the difference in voltage between gate and source terminals of the NMOS transistor 5001, i.e., the difference between the bias voltage Vbias and the voltage at the node 5003 decreases. Thus, the NMOS transistor 5001 is turned off to interrupt a current path from the external voltage VDD to the variable resistive element 3001.

That is, the semiconductor integrated circuit 2 shown in FIG. 5 can control the current flowing through the variable resistive element 3001 in response to the resistance of the variable resistive element 3001.

Then, the input signal DHB is deactivated as a low-level signal. If the input signal DH is deactivated as a high-level signal, the NMOS transistor 3007 and the PMOS transistor 5002 are turned off to interrupt the current path and sink current path of the variable resistive element 3001.

In the current control unit 100b shown in FIG. 5, the current path of the node 5003 is provided or interrupted from the external voltage VDD by the bias voltage Vbias. Therefore, the amplitude of the bias voltage Vbias and the channel characteristic of the NMOS transistor 5001 may be set to having an optimal design value so that the current path can be provided or interrupted depending on a voltage level at the node 5003.

Figure 6:
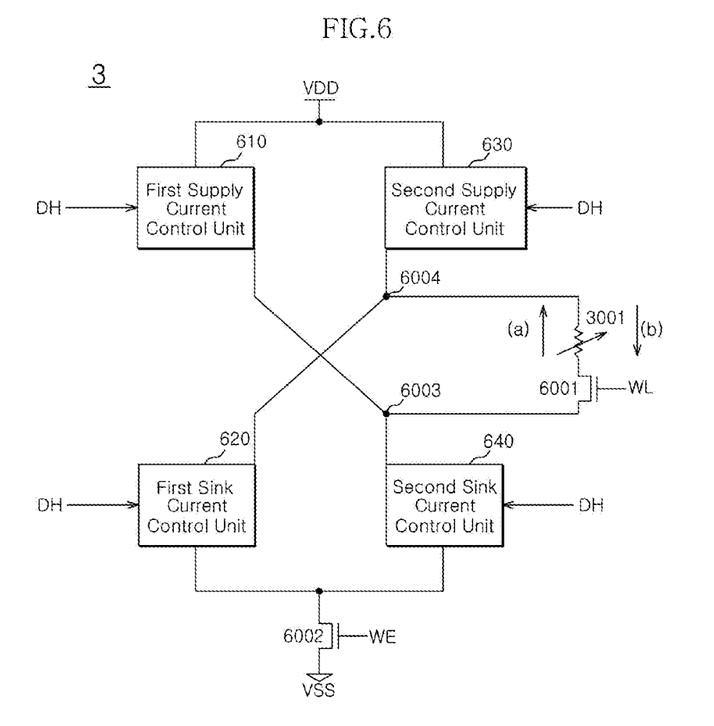
FIG. 6 is a schematic circuit diagram of a semiconductor integrated circuit according to still an embodiment of the present invention.

FIG. 6 is a schematic circuit diagram of a semiconductor integrated circuit 3 according to an embodiment of the present invention.

The semiconductor integrated circuit 3 shown in FIG. 6 is suitably used in a nonvolatile semiconductor memory device capable of being activated in response to a write enable signal WE and a word line select signal WL.

The semiconductor integrated circuit 3 shown in FIG. 6 is configured to control current to flow in both directions through a variable resistive element 3001.

The semiconductor integrated circuit 3 may include a variable resistive element 3001, a first supply current control unit 610, a first sink current control unit 620, a second supply current control unit 630 and a second sink current control unit 640.

In FIG. 6, there are shown an NMOS transistor 6001 that receives the word line select signal WL and an NMOS transistor 6002 that receives the write enable signal WE. However, the NMOS transistors 6001 and 6002 are shown to illustrate that the semiconductor integrated circuit 3 shown in FIG. 6 can be used in the nonvolatile memory device. The NMOS transistors 6001 and 6002 are not essential elements necessary for embodying the present invention, and may be omitted.

The variable resistive element 3001 is connected between a first node 6003 and a second node 6004, and the resistance of the variable resistive element 3001 is changed depending on the direction of current between the first and second nodes 6003 and 6004. The variable resistive element 3001 may include the variable resistive element 3001 shown in FIGS. 3 to 5.

The first supply current control unit 610 is connected between an external voltage VDD and the first node 6003. The first supply current control unit 610 controls the supply of current from the external voltage VDD to the first node 6003.

The first sink current control unit 620 is connected between the second node 6004 and a ground voltage VSS. The first sink current control unit 620 controls a current sink from the second node 6004 to the ground voltage VSS according to an input signal DH.

The second supply current control unit 630 is connected between the external voltage VDD and the second node 6004. The second supply current control unit 630 controls the supply of current from the external voltage VDD to the second node 6004 according to the input signal DH.

The second sink current control unit 640 is connected between the first node 6003 and the ground voltage VSS. The second sink current control unit 640 controls a current sink from the first node 6003 to the ground voltage VSS according to the input signal DH.

One or more of the first supply current control unit 610, the first sink current control unit 620, the second supply current control unit 630 and the second sink current control unit 640 control the current according to not only the input signal DH but also the resistance of the variable resistive element 3001.

The semiconductor integrated circuit 3 configured as shown in FIG. 6 activates the first supply current control unit 610 and the first sink current control unit 620, and deactivates the second supply current control unit 630 and the second sink current control unit 640, so that the current can flow in direction (a) through the variable resistive element 3001.

On the contrary, the semiconductor integrated circuit 3 activates the second supply current control unit 630 and the second sink current control unit 640, and deactivates the first supply current control unit 610 and the first sink current control unit 620, so that the current can flow in direction (b) through the variable resistive element 3001.

In the semiconductor integrated circuit 3, one or more of the first supply current control unit 610, the first sink current control unit 620, the second supply current control unit 630 and the second sink current control unit 640.

Figure 7:
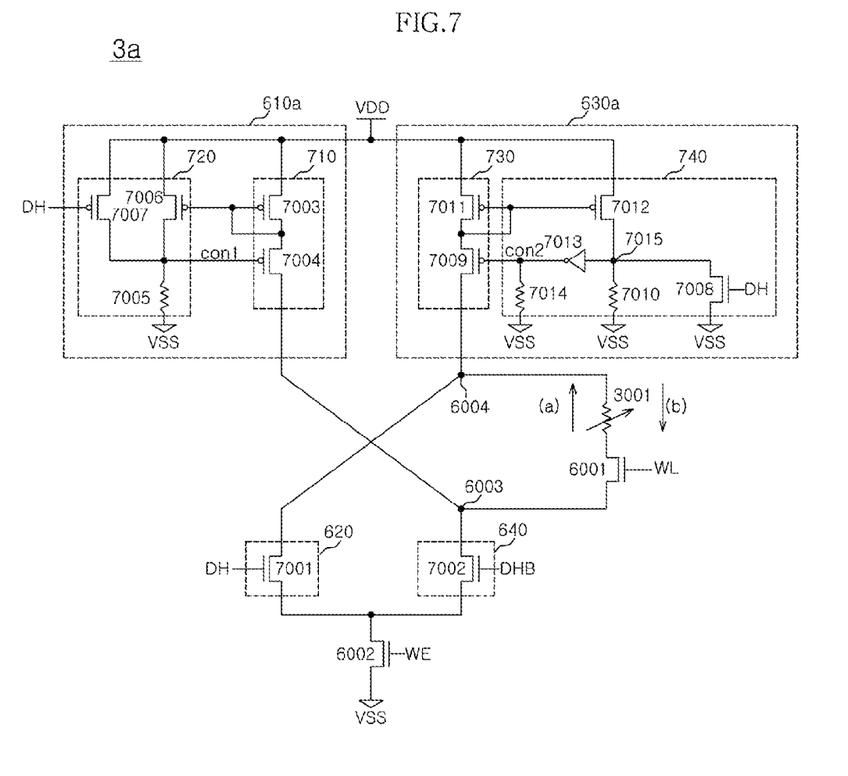
FIG. 7 is a circuit diagram illustrating an embodiment of the semiconductor integrated circuit shown in FIG. 6.

FIG. 7 is a circuit diagram illustrating an embodiment of the semiconductor integrated circuit 3 shown in FIG. 6.

The semiconductor integrated circuit 3a shown in FIG. 7 is configured so that the first sink current control unit 620 and the second sink current control unit 640 control current according to the input signals DH and DHB.

The semiconductor integrated circuit 3a is configured so that a first supply current control unit 610a and a second supply current control unit 630a control the current according to not only the input signal DH but also the resistance of the variable resistive element 3001.

The first sink current control unit 620 may include an NMOS transistor 7001 connected between the second node 6004 and the drain terminal of the NMOS transistor 6002 so as to receive the input signal DH through a gate terminal thereof.

The second sink current control unit 640a may include an NMOS transistor 7002 connected between the first node 6003 and the drain terminal of the NMOS transistor 6002 so as to receive the input signal DHB through a gate terminal thereof.

The first supply current control unit 610a may include a control unit 710 and a control signal generating unit 720.

The control unit 710 controls the supply of current from the external voltage VDD to the first node 6003 in response to a control signal cont.

The control signal generating unit 720 senses a resistance of the variable resistive element 3001 and generates the control signal cord in response to the sensed result and the input signal DH.

Here, the control signal generating unit 720 may be configured to use the input signal DH prior to the sensed result when determining the presence of activation of the control signal cord. Thus, while the first supply current control unit 510a supplies current to the first node 6003 from the external voltage VDD, the second supply current control unit 603a interrupts a current path from the external voltage VDD to the second node 6004 in response to the input signal DH. The operating method of the control signal generating unit 720 will be described in detail below.

The control signal generating unit 720 generates a duplicate current having an amount in proportion to that of the current flowing through the variable resistive element 3001 and applies the generated current to a reference resistor 7006. The control signal generating unit 720 uses the amplitude of a voltage applied to the reference resistor 7006 as the sensed result.

To this end, the control unit 710 and the control signal generating unit 720 can be configured in the form of a current-mirror type amplifier as shown in FIG. 7.

The control unit 710 can be configured similarly to the current supply unit 110 shown in FIG. 3. The control unit 710 may include PMOS transistors 7003 and 7004.

The PMOS transistors 7003 and 7004 are connected in series between the external voltage VDD and the first node 6003.

Gate and drain terminals of the PMOS transistor 7003 are connected to each other. A gate terminal of the PMOS transistor 7004 receives the control signal cont.

The control signal generating unit 720 may include a reference resistor 7005 and PMOS transistors 7006 and 7007.

The reference resistor 7005 is connected between the gate terminal of the PMOS transistor 7004 and the ground voltage VSS.

The PMOS transistors 7006 and 7007 are connected in parallel between the external voltage VDD and the gate terminal of the PMOS transistor 7004.

A gate terminal of the PMOS transistor 7006 is connected to the gate terminal of the PMOS transistor 7003.

A gate terminal of the PMOS transistor 7007 receives the input signal DH.

The input signal DHB is an inverted signal of the input signal DH.

The second supply current control unit 630a may include a control unit 730 and a control signal generating unit 740.

The control unit 730 controls the supply of the current from the external voltage VDD to the second node 6004 in response to a control signal con2.

The control signal generating unit 740 senses a resistance of the variable resistive element 3001 and generates the control signal con2 in response to the sensed result and the input signal DH.

Here, the control signal generating unit 740 may be configured to use the input signal DH prior to the sensed result when determining the presence of activation of the control signal con2. Thus, while the second supply current control unit 630a supplies current to the second node 6004 from the external voltage VDD, the first supply current control unit 610a interrupts a current path from the external voltage VDD to the first node 6003 in response to the input signal DH.

The control signal generating unit 740 generates a duplicate current having an amount in proportion to that of the current flowing through the variable resistive element 3001 and applies the generated current to a reference resistor 7010. The control signal generating unit 740 uses the amplitude of a voltage applied to the reference resistor 7010 as the sensed result.

To this end, the control unit 730 and the control signal generating unit 740 can be configured in the form of a current-mirror type amplifier as shown in FIG. 7.

The control unit 730 can be configured similarly to the current supply unit 110 shown in FIG. 3. The control unit 730 may include PMOS transistor 7011 and 7009.

The PMOS transistors 7011 and 7009 are connected in series between the external voltage VDD and the second node 6004.

Gate and drain terminals of the PMOS transistor 7011 are connected to each other. A gate terminal of the PMOS transistor 7009 receives the control signal cont.

The control signal generating unit 740 may include a reference resistor 7010, a PMOS transistor 7012, an inverter 7013, an NMOS transistor 7008 and a sink resistor 7014.

The sink resistor 7014 is connected between the gate terminal of the PMOS transistor 7009 and the ground voltage VSS.

The PMOS transistor 7012 and the reference resistor 7010 are connected in series between the external voltage VDD and the ground voltage VSS.

A gate terminal of the PMOS transistor 7012 is connected to the gate terminal of the PMOS transistor 7011.

The NMOS transistor 7008 is connected between the ground voltage VSS and a node 7016 at which the PMOS transistor 7012 and the reference resistor 7010 are connected to each other so as to receive the input signal DH through a gate terminal thereof.

The inverter 7013 inverts a voltage at the node 7015 and applies the inverted voltage as the control signal con2 to the gate terminal of the PMOS transistor 7009.

The semiconductor integrated circuit 3a configured as shown in FIG. 7 operates as follows.

In the semiconductor integrated circuit 3a shown in FIG. 7, when the input signal DH is a high-level signal as described above, the first supply current control unit 610a and the first sink current control unit 620 are activated, and the second supply current control unit 630a and the second sink current control unit 640 are deactivated. Accordingly, current is controlled to flow in direction (a) in the variable resistive element 3001.

When the input signal DH is a high-level signal, the NMOS transistor 7002 of the second sink current control unit 640 is turned off to interrupt a current path from the first node 6003 to the ground voltage VSS.

The NMOS transistor 7008 of the second supply current control unit 630a is turned on to boost the gate voltage of the PMOS transistor 7009. Accordingly, the PMOS transistor 7009 is turned off, and the current path from the external voltage VDD to the second node 6004 is interrupted.

The NMOS transistor 7001 of the first sink current control unit 620 is turned on to provide a current path from the second node 6004 to the ground voltage VSS.

The PMOS transistor 7007 of the first supply current control unit 610a is turned off so that the voltage level of the control signal con1 inputted to the gate terminal of the PMOS transistor 7004 decreases by the reference resistor 7005.

Accordingly, the PMOS transistor 7004 is turned on to provide the current path from the external voltage VDD to the first node 6003.

If the write enable signal WE is activated as a high-level signal, the current flows from the external voltage VDD to the ground voltage VSS via the first supply current control unit 610a, the variable resistive element 3001 and the first sink current control unit 620, i.e., in the direction (a), as the NMOS transistor 6002 is turned on.

As the current flows through the variable resistive element 3001 for a predetermined time or more, the resistance of the variable resistive element 3001 is changed from a high resistance to a low resistance. Accordingly, the amount of the current flowing in the direction (a) increases.

If the amount of the current flowing through the variable resistive element 3001 increases, the amount of the duplicate current generated by the control signal generating unit 720 of the first supply current control unit 610a increases, and accordingly, the voltage applied to the reference resistor 7005 is boosted.

As the voltage applied to the reference resistor 7005 is boosted, the PMOS transistor 7004 is turned off to interrupt the current path from the external voltage VDD to the first node 6003.

Accordingly, after the resistance of the variable resistive element 3001 is changed from the high resistance to the low resistance, the current flowing in the direction (a) through the variable resistive element 3001 is interrupted.

On the contrary, when the input signal DH is a low-level signal, the second supply current control unit 630a and the second sink current control unit 640 are activated, and the first supply current control unit 610a and the first sink current control unit 620 are deactivated. Accordingly, the current is controlled to flow in direction (b) in the variable resistive element 3001.

When the input signal DH is a low-level signal, the NMOS transistor 7001 of the first sink current control unit 620 is turned off to interrupt the current path from the second node 6004 to the ground voltage VSS.

The PMOS transistor 7007 in the first supply current control unit 610a is turned on to boost the gate voltage of the PMOS transistor 7004. Accordingly, the PMOS transistor 7004 is turned off to interrupt the current path from the external voltage VDD to the first node 6003.

The NMOS transistor 7002 in the second sink current control unit 640a is turned on to provide the current path from the first node 6003 to the ground voltage VSS.

The control signal con2 is discharged by the sink resistor 7014 and falls to a low-level signal.

Accordingly, the PMOS transistor 7009 is turned on to provide the current path from the external voltage VDD to the second node 6004.

If the write enable signal WE is activated as a high-level signal, the current flows from the external voltage VDD to the ground voltage VSS via the second supply current control unit 630a, the variable resistive element 3001 and the second sink current control unit 640, i.e., in the direction (b), as the NMOS transistor 6002 is turned on.

As the current flows through the variable resistive element 3001 for a predetermined time or more, the resistance of the variable resistive element 300 is changed from a low resistance to a high resistance. Accordingly, the amount of the current flowing in the direction (b) decreases.

If the amount of the current flowing through the variable resistive element 3001 decreases, the amount of the duplicate current generated by the control signal generating unit 740 of the second supply current control unit 630a decreases, and accordingly, the amplitude of a voltage applied to the reference resistor 7010 decreases.

As the amplitude of the voltage applied to the reference resistor 7010 decreases, the inverter 7013 boosts the voltage of the control signal cont. Accordingly, the PMOS transistor 7009 is turned off to interrupt the current path from the external voltage VDD to the second node 6004.

Thus, after the resistance of the variable resistive element 3001 is changed from the low resistance to the high resistance, the current flowing in the direction (b) through the variable resistive element 3001 is interrupted.

In the semiconductor integrated circuit 3a shown in FIG. 7, unlike the first and second sink current control units 620 and 640, each of the first and second supply current control units 610a and 630a is configured as the first control unit 710 and the control signal generating unit so as to control the current according to not only the input signals DH and DHB but also the resistance of the variable resistive element 3001.

However, as described above, the configuration is provided only for illustrative purposes. It can be readily understood by those skilled in the art that one or more of the first supply current control unit 610*a*, the first sink current control unit 620, the second supply current control unit 630*a* and the second sink current control unit 640 may include the control unit and the control signal generating unit so as to control the current according to not only the input signals DH and DHB but also the resistance of the variable resistive element 3001.

Figure 8:
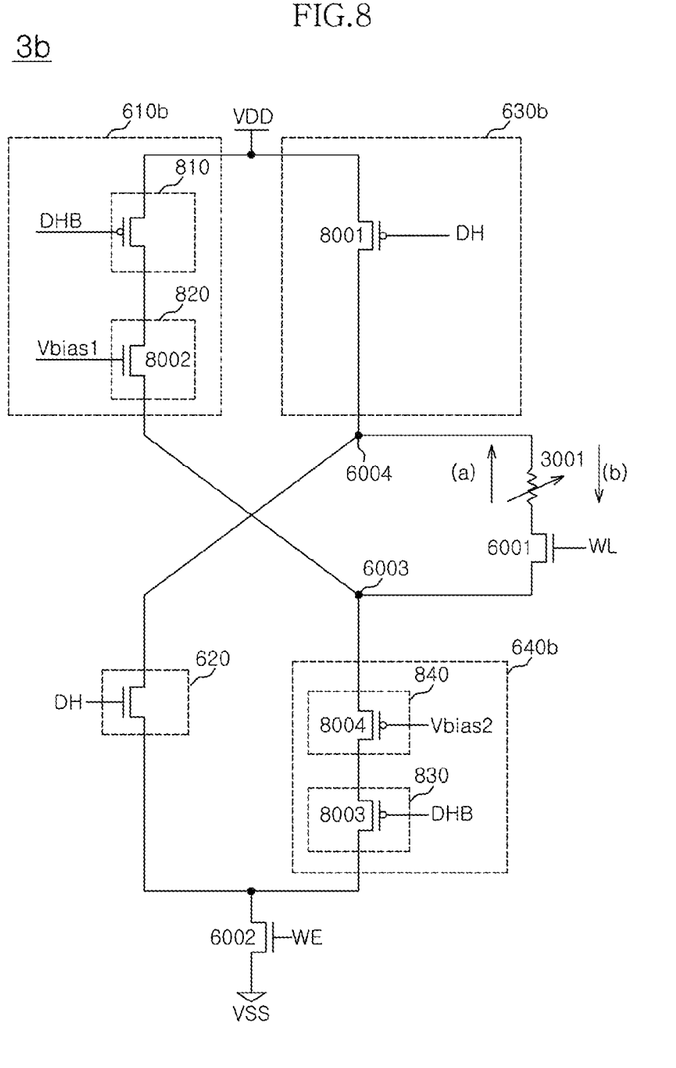
FIG. 8 is a circuit diagram illustrating an embodiment of the semiconductor integrated circuit shown in FIG. 6.

FIG. 8 is a circuit diagram illustrating an embodiment of the semiconductor integrated circuit 3 shown in FIG. 6.

A first sink current control unit 620 and a second supply current control unit 630*b*, shown in FIG. 8, are configured to control current only in response to the input signals DH and DHB.

The first sink current control unit 620 shown in FIG. 8 can be configured identically to the first sink current control unit 620 shown in FIG. 6. Therefore, its detailed description will be omitted.

The second supply current control unit 630*b* shown in FIG. 8 may include a PMOS transistor 8001 connected between the external voltage VDD and the second node 6004.

The PMOS transistor 8001 receives the input signal DH through a gate terminal thereof.

Like the first and second supply current control units 610*a* and 630*a* shown in FIG. 6, a first supply current control unit 610*b* and a second sink current control unit 640*b*, shown in FIG. 8, are configured to control the current according to not only the input signal DHB but also the resistance of the variable resistive element 3001.

The first supply current control unit 610*b* may include a current supply unit 810 and an interrupting unit 820.

The current supply unit 810 supplies the current from the external voltage VDD in response to the input signal DHB.

The current supply unit 810 can be configured identically to the current supply unit 140 shown in FIG. 5. Therefore, its detailed description will be omitted.

The interrupting unit 820 connects or interrupts a path along which the current flows through the variable resistive element 3001 according to the voltage level at the first node 6003 changed depending on the resistance of the variable resistive element 3001.

The interrupting unit 820 may include an NMOS transistor 8002 turned on or off depending on a difference in voltage between the first node 6002 and a gate terminal thereof.

The NMOS transistor 8002 receives a bias voltage Vbias1 through the gate terminal thereof. The bias voltage Vbias1 is a voltage with a predetermined level. The bias voltage Vbias1 may be set so that the NMOS transistor 8002 is turned on or off depending on a change in resistance of the variable resistive element 3001.

The second sink current control unit 640*b* may include a current supply unit 830 and an interrupting unit 840.

The current supply unit 830 is connected between the interrupting unit 840 and the ground voltage VSS. The current supply unit 830 connects a current path from the interrupting unit 840 to the ground voltage VSS via the NMOS transistor 6002 in response to the input signal DHB.

The current supply unit 830 may include an NMOS transistor 8003 connected between the interrupting unit 840 and the drain terminal of the NMOS transistor 6002 so as to receive the input signal DHB through a gate terminal thereof.

The interrupting unit 840 connects or interrupts a path along which the current flows through the variable resistive element 3001 according to the voltage level at the first node 6003 changed depending on the resistance of the variable resistive element 3001.

The interrupting unit 840 may include a PMOS transistor 8004 turned on or off depending on a difference in voltage between the first node 6003 and a gate terminal thereof.

The PMOS transistor 8004 receives a bias voltage Vbias 2 through the gate terminal thereof. The bias voltage Vbias2 is a voltage with a predetermined level. The bias voltage Vbias2 may be set so that the PMOS transistor 8004 can be turned on or off depending on a change in resistance of the variable resistive element 3001.

The semiconductor integrated circuit 3*b* shown in FIG. 8 is configured that the direction of the current is changed into the direction (a) or (b) according to the input signal DH or DHB, and the path at which the current flows through the variable resistive element 3001 is connected or interrupted according to the voltage level of the first node 6003 changed depending on the change in resistance of the variable resistive element 3001.

The operating method of the semiconductor integrated circuit 3*b* shown in FIG. 8 is similar to that of the semiconductor integrated circuit 2 shown in FIG. 5. Therefore, its detailed description will be omitted.

In a case where the variable resistive element 3001 is used as a memory element for transforming a variable resistive state, the semiconductor integrated circuit shown in FIGS. 3 to 8 can supply or interrupt current flowing through the memory element according to whether or not previously recorded data and new data are identical to each other.

For example, it is assumed that although a semiconductor memory device including the memory element is configured as shown in FIG. 7, and a command for re-recording '0' in the memory element is inputted although '0' has been previously recorded in the memory element.

Although the variable resistive element 3001 is in the state that it has a low resistance due to the current flowing in direction (a), i.e., in the state that '0' has been previously recorded in the variable resistive element 3001, the current flows in the direction (a) so that '0' is recorded in the variable resistive element 3001. This may be an unnecessary current flow regardless of recording of data.

As described above, in a variable resistive element such as an MTJ, the increase of a time when the current flows through the variable resistive element may result in the degradation of the variable resistive element. Therefore, if the unnecessary current flow is restricted, a probability of degradation of the variable resistive element may decrease.

When the input signal DH is a high-level signal and the write enable signal WE is activated as a high-level signal in the state that the variable resistive element 3001 is changed into the low resistance by the current in the direction (a), the current in the direction (a) is generated.

However, since the variable resistive element 3001 has been previously in the state that it has a low resistance, the amount (I2 of FIG. 2) of the current in the direction (a) is greater than that (I1 of FIG. 2) of the current in the state that the variable resistive element is in the state that it has a high resistance.

The control signal generating unit 720 generates a duplicate current having an amount greater than that of the current in the state that the variable resistive element 3001 has a high resistance, and applies the generated current to the reference resistor 7005. Accordingly, the voltage of the control signal con1 is boosted, and the PMOS transistor 7004 is turned off, so that the current path from the external voltage VDD to the first node 6003 is interrupted.

In the operating method, the presence of identity between the previously recorded data and new data for recording can be determined by the amount of the current flowing through the variable resistive element 3001 according to the resistance of the variable resistive element 3001 (or the voltage level of a predetermined node according to the resistance of the variable resistive element 3001) and the input signal DH or DHB.

According to exemplary embodiments described above, the current flowing through the variable resistive element 3001 is interrupted by sensing the resistance of the variable resistive element 3001, and hence the current flowing through the variable resistive element 3001 is supplied, according to an example, only when the resistance of the variable resistive element 3001 is changed.

Further, in the semiconductor integrated circuit according to the present invention, the current flowing through the variable resistive element 3001 is supplied, according to an example, only when the resistance of the variable resistive element 3001 is changed, and thus the current supply characteristic may become more insensitive to the PVT variation.

Moreover, in the semiconductor integrated circuit according to the present invention, the presence of the identity between the previously recorded data and new data for recording is determined by sensing the resistance of the variable resistive element 3001, and thus it is possible to prevent unnecessarily recording of duplicate current in the variable resistive element 3001.

Therefore, current consumption may decrease, and thus lifespan of a semiconductor devise may increase.

The semiconductor integrated circuit according to an embodiment of the present invention does not require a separate sensing time for sensing the resistance of the variable resistive element or a specific sensor. Thus, the semiconductor integrated circuit can be applied to a high speed semiconductor integrated circuit or highly integrated semiconductor integrated circuit.

While certain embodiments have been described above, it will be understood to those skilled in the art that the embodiments described are by way of example only. Accordingly, the circuit and method described herein should not be limited based on the described embodiments. Rather, the circuit and method described herein should only be limited in light of the claims that follow when taken in conjunction with the above description and accompanying drawings.

What is claimed is:

1. A semiconductor integrated circuit, comprising:
   a variable resistive element coupled between a first node and a second node, the variable resistive element of which resistance is changed depending on the direction of current between the first and second nodes;
   a first supply current control unit coupled between an external voltage and the first node so as to control the supply of current from the external voltage to the first node in response to an input signal;
   a first sink current control unit coupled between the second node and a ground voltage so as to control a current sink from the second node to the ground voltage in response to the input signal;
   a second supply current control unit coupled between the external voltage and the second node so as to control the supply of current from the external voltage to the second node in response to the input signal; and
   a second sink current control unit coupled between the first node and the ground voltage so as to control a current sink from the first node to the ground voltage in response to the input signal,
   wherein one or more of the first supply current control unit, the first sink current control unit, the second supply current control unit and the second sink current control unit control the current according to both of the input signal and the resistance of the variable resistive element.

2. The semiconductor integrated circuit according to claim 1, wherein the one or more of the first supply current control unit, the first sink current control unit, the second supply current control unit and the second sink current control unit comprise:
   a control unit configured to control the current in response to a control signal; and
   a control signal generating unit configured to sense the resistance of the variable resistive element and generate the control signal in response to the sensed result and the input signal.

3. The semiconductor integrated circuit according to claim 2 wherein the control signal generating unit determines an activation of the control signal regardless of the sensed result when the input signal is a signal having a predetermined level.

4. The semiconductor integrated circuit according to claim 2, wherein the control signal generating unit generates a duplicate current having an amount in proportion to that of the current and applies the generated current to a reference resistor, and uses a voltage applied to the reference resistor as the sensed result.

5. The semiconductor integrated circuit according to claim 3, wherein the control unit and the control signal generating unit are configured in the form of a current-mirror type amplifier.

6. The semiconductor integrated circuit according to claim 2, wherein the one or more of the first supply current control unit, the first sink current control unit, the second supply current control unit and the second sink current control unit comprise:
   a current supply unit configured to control the current in response to the input signal; and
   an interrupting unit configured to connect or interrupt a path along which the current flows through the variable resistive element according to the voltage level of a predetermined node changed depending on a change in the resistance of the variable resistive element.

7. The semiconductor integrated circuit according to claim 6, wherein the interrupting unit includes a MOS transistor configured to interrupt the path along the current flows through the variable resistive element or provide the path according to a difference in voltage between the predetermined node and a gate terminal thereof.

8. The semiconductor integrated circuit according to claim 2, wherein the variable resistive element comprises:
   a first ferromagnetic layer coupled to the first node;
   a second ferromagnetic layer coupled to the second node; and
   an insulating layer formed between the first and second ferromagnetic layers.

9. The semiconductor integrated circuit according to claim 8, wherein the spin direction of one of the first and second ferromagnetic layers is not changed by the current, the spin direction of the other of the first and second ferromagnetic layers is changed by the current, and the resistance of the variable resistive element is changed depending on the spin directions of the first and second ferromagnetic layers.

10. A semiconductor integrated circuit comprising:
    a memory element for transforming a variable resistive state, coupled between a first node and a second node, the memory element of which resistance is changed depending on a direction of current between the first and second nodes;

a first supply current control unit coupled between an external voltage and the first node so as to control the supply of current from the external voltage to the first node in response to an input signal received as new data for recording;

a first sink current control unit coupled between the second node and a ground voltage so as to control a current sink from the second node to the ground voltage in response to the input signal;

a second supply current control unit coupled between the external voltage and the second node so as to control the supply of current from the external voltage to the second node in response to the input signal; and a second sink current control unit coupled between the first node and the ground voltage so as to control a current sink from the first node to the ground voltage in response to the input signal, wherein one or more of the first supply current control unit, the first sink current control unit, the second supply current control unit and the second sink current control unit supply or interrupt the current flowing through the memory element depending on an identity between data previously recorded in the memory element and new data for recording.

11. The semiconductor integrated circuit according to claim 10, wherein the one or more of the first supply current control unit, the first sink current control unit, the second supply current control unit and the second sink current control unit determine the identity between the data previously recorded in the memory element and the new data for recording using the amount of the current determined according to the resistance of the memory element and the input signal.

12. The semiconductor integrated circuit according to claim 11, wherein the one or more of the first supply current control unit, the first sink current control unit, the second supply current control unit and the second sink current control unit comprise:

a current supply unit configured to supply or interrupt the current in response to a control signal; and a control signal generating unit configured to sense the amount of the current determined according to the resistance of the memory element and generate the control signal according to the amount of the current and the input signal.

13. The semiconductor integrated circuit according to claim 12, wherein the control signal generating unit generates the control signal according to whether or not the amount of the current is a predetermined value or more and an activation of the control signal.

14. The semiconductor integrated circuit according to claim 13, wherein the control signal generating unit determines the activation of the control signal regardless of whether or not the amount of the current is the predetermined value or more when the input signal is activated.

15. The semiconductor integrated circuit according to claim 12, wherein the current supply unit and the control signal generating unit are configured in the form of a current-mirror type amplifier.

16. The semiconductor integrated circuit according to claim 15, wherein the control signal generating unit generates a duplicate current having an amount in proportion to that of the current between the first and second nodes and applies the generated current to a reference resistor, and senses the amount of the current using the amplitude of a voltage applied to the reference resistor.

17. The semiconductor integrated circuit according to claim 10, wherein the one or more of the first supply current control unit, the first sink current control unit, the second supply current control unit and the second sink current control unit determine the identity between the data previously recorded in the memory element and the new data for recording using the voltage level of a predetermined node according to the resistance of the memory element and the input signal.

18. The semiconductor integrated circuit according to claim 17, wherein the one or more of the first supply current control unit, the first sink current control unit, the second supply current control unit and the second sink current control unit comprise:

a control unit configured to control the current in response to the input signal; and an interrupting unit configured to connect or interrupt a path along the current flows through the memory element according to the voltage level of the predetermined node changed depending on the resistance of the memory element.

19. The semiconductor integrated circuit according to claim 18, wherein the interrupting unit includes a MOS transistor configured to interrupt the path along the current flows through the memory element or provide the path according to a difference in voltage between the predetermined node and a gate terminal thereof.

20. The semiconductor integrated circuit according to claim 10, wherein the memory element comprises:

a first ferromagnetic layer;

a second ferromagnetic layer; and an insulating layer formed between the first and second ferromagnetic layers, to wherein the resistance of the memory element is changed depending on current flowing through the first ferromagnetic layer, the insulating layer and the second ferromagnetic layer.

* * * * *